(12) United States Patent
Andino et al.

(10) Patent No.: US 7,860,594 B2
(45) Date of Patent: Dec. 28, 2010

(54) METHOD FOR MAKING OPTHALMIC DEVICES

(75) Inventors: Rafael Victor Andino, Lawrenceville, GA (US); Robert Scott Meece, Alpharetta, GA (US); David Rosen, Marietta, GA (US); Benay Sager, Smyrna, GA (US)

(73) Assignee: Novartis AG, Basel (CH)

( * ) Notice: Subject to any disclaimer, the term of this patent is extended or adjusted under 35 U.S.C. 154(b) by 294 days.

(21) Appl. No.: 11/787,614

(22) Filed: Apr. 17, 2007

(65) Prior Publication Data

US 2007/0194499 A1    Aug. 23, 2007

Related U.S. Application Data

(62) Division of application No. 10/655,501, filed on Sep. 3, 2003, now Pat. No. 7,235,195.

(60) Provisional application No. 60/408,714, filed on Sep. 6, 2002.

(51) Int. Cl.
  *G02B 1/04* (2006.01)
  *G02B 1/12* (2006.01)
  *C08F 290/06* (2006.01)
  *B28B 17/00* (2006.01)
  *B28B 1/14* (2006.01)
  *G02C 7/02* (2006.01)
  *A61B 3/10* (2006.01)
  *B29D 11/00* (2006.01)
  *B29D 7/01* (2006.01)
  *B29C 35/04* (2006.01)
  *G06F 19/00* (2006.01)

(52) U.S. Cl. .............. 700/98; 425/174.4; 523/106; 523/107; 700/107; 700/119; 700/120; 351/177; 351/211; 264/1.32; 264/1.36; 264/1.37; 264/1.38; 264/308; 264/401

(58) Field of Classification Search .............. 700/98, 700/120, 107, 119; 425/174.4; 523/106, 523/107; 351/177, 211; 264/1.32, 1.36, 264/1.37, 1.38, 308, 401
See application file for complete search history.

(56) References Cited

U.S. PATENT DOCUMENTS 4,420,228 A * 12/1983 Humphrey ............... 351/212

(Continued)

FOREIGN PATENT DOCUMENTS

DE        27 38 084        3/1978

(Continued)

OTHER PUBLICATIONS

Maruo et al., "Submicron Stereolithography for the Production of Freely Moveable Mechanism by Using Single-Photon Polymerization", Dept. of Engineering, Nagoya University Feb. 2002,p. 70-76.*

(Continued)

*Primary Examiner*—Ramesh B Patel
*Assistant Examiner*—Thomas H Stevens
(74) *Attorney, Agent, or Firm*—Sheng-Hsin Hu; Jian Zhou (57) ABSTRACT

The present invention provides a method for making an ophthalmic device. In particular, the present invention provides a method for production of a contact lens by means of stereolithography. A preferred stereolithography technique is based on polymerization and solidification of a contact lens forming liquid material by actinic irradiation one layer at a time. In addition, the present invention provides systems and methods for making a contact lens for a specific patient based on the prescription.

7 Claims, 1 Drawing Sheet

U.S. PATENT DOCUMENTS

| | | | |
|---|---|---|---|
| 4,466,080 A | 8/1984 | Swainson | |
| 4,879,318 A * | 11/1989 | Lipscomb et al. | 522/42 |
| 4,988,274 A | 1/1991 | Kenmochi | 425/174.4 |
| 5,014,207 A * | 5/1991 | Lawton | 700/120 |
| 5,139,711 A * | 8/1992 | Nakamura et al. | 264/401 |
| 5,143,663 A * | 9/1992 | Leyden et al. | 264/401 |
| 5,154,861 A | 10/1992 | McBrierty et al. | 264/1.4 |
| 5,182,056 A | 1/1993 | Spence et al. | 264/22 |
| 5,204,823 A * | 4/1993 | Schlotterbeck | 700/120 |
| 5,490,962 A | 2/1996 | Cima et al. | 264/22 |
| 5,500,069 A * | 3/1996 | Ogue et al. | 264/401 |
| 5,569,431 A * | 10/1996 | Hull | 264/401 |
| 5,854,299 A * | 12/1998 | Muhlebach et al. | 522/66 |
| 5,939,489 A | 8/1999 | Muller | 525/61 |
| 6,027,324 A | 2/2000 | Hull | 425/174.4 |
| 6,175,422 B1 | 1/2001 | Penn et al. | 358/1.1 |
| 6,179,039 B1 | 1/2001 | Grinberg et al. | 164/4.1 |
| 6,179,601 B1 | 1/2001 | Kruger et al. | 425/714.4 |
| 6,193,922 B1 | 2/2001 | Ederer | 264/401 |
| 6,205,243 B1 | 3/2001 | Migdal et al. | 382/154 |
| 6,207,097 B1 | 3/2001 | Iverson | 264/401 |
| 6,214,276 B1 | 4/2001 | Gelbart | 264/401 |
| 6,215,095 B1 | 4/2001 | Partanen et al. | 219/121.62 |
| 6,241,934 B1 | 6/2001 | Everett et al. | 264/401 |
| 6,243,616 B1 | 6/2001 | Droscher et al. | 700/118 |
| 6,254,639 B1 | 7/2001 | Peckitt | 623/11.11 |
| 6,261,506 B1 | 7/2001 | Nguyen et al. | 264/401 |
| 6,261,507 B1 | 7/2001 | Gigl et al. | 264/401 |
| 6,264,873 B1 | 7/2001 | Gigl et al. | 264/401 |
| 6,366,825 B1 | 4/2002 | Smalley et al. | 700/120 |
| 6,406,658 B1 | 6/2002 | Manners et al. | 264/401 |
| 6,432,607 B1 | 8/2002 | Tamura et al. | 430/269 |
| 6,574,523 B1 | 6/2003 | Hanna et al. | 700/120 |
| 6,579,918 B1 * | 6/2003 | Auten et al. | 523/106 |
| 6,719,929 B2 | 4/2004 | Winterton et al. | 264/1.7 |
| 7,051,290 B2 * | 5/2006 | Foreman et al. | 715/810 |
| 7,088,432 B2 | 8/2006 | Zhang | 355/77 |
| 7,111,938 B2 * | 9/2006 | Andino et al. | 351/212 |
| 7,235,195 B2 * | 6/2007 | Andino et al. | 264/1.32 |
| 7,384,143 B2 * | 6/2008 | Hall et al. | 351/177 |
| 7,471,821 B2 * | 12/2008 | Rubbert et al. | 382/154 |
| 2001/0008230 A1 | 7/2001 | Keicher et al. | 219/121.63 |
| 2001/0025203 A1* | 9/2001 | Gervasi | 700/98 |
| 2001/0032111 A1 | 10/2001 | Jensen, Jr. et al. | 705/8 |
| 2001/0044651 A1 | 11/2001 | Steinke et al. | 623/1.16 |
| 2001/0046642 A1 | 11/2001 | Johnson et al. | 430/280.1 |
| 2001/0048184 A1 | 12/2001 | Ueno | 264/401 |
| 2002/0059049 A1 | 5/2002 | Bradbury et al. | 703/11 |
| 2002/0068801 A1 | 6/2002 | Steinmann et al. | 525/531 |
| 2002/0081505 A1 | 6/2002 | Lawton et al. | 430/18 |
| 2002/0165635 A1* | 11/2002 | Farren | 700/120 |

FOREIGN PATENT DOCUMENTS

| | | |
|---|---|---|
| EP | 0 096 806 | 9/1986 |
| EP | 0 348 061 A2 | 12/1989 |
| EP | 0 384 632 | 7/1994 |
| EP | 0 848 654 | 11/2001 |
| JP | 61116322 | 6/1986 |
| JP | 2000313067 | 11/2000 |
| WO | WO 01/14127 | 3/2001 |
| WO | WO 01/36171 | 5/2001 |
| WO | WO 01/85040 | 11/2001 |
| WO | WO 01/85386 | 11/2001 |
| WO | WO 01/96915 | 12/2001 |
| WO | WO 02/27408 A2 | 4/2002 |
| WO | WO 03/040242 | 5/2003 |

OTHER PUBLICATIONS

Efron-N., "Contact Lens Practice and a Very Soft Option", 2000, Clinical and Experimental Optometry, p. 243-245,339,44, and 45.*
Finger et al., "Three-Dimensional Ultrasonography of Choroidal Melanoma", 1998, Arch Ophthalmol/vol. 116, p. 305-312.*

* cited by examiner

Figure 1

METHOD FOR MAKING OPTHALMIC DEVICES

This application is a division of U.S. patent application Ser. No. 10/655,501 filed Sep. 3, 2003, now U.S. Pat. No. 7,235,195, which claims the benefit under 35 U.S.C. §119(e) of U.S. Provisional Patent Application Ser. No. 60/408,714 filed Sep. 6, 2002, herein incorporated by reference in its entirety.

The present invention is related to a method for making an ophthalmic device. In particular, the present invention is related to a method for production of an ophthalmic device by means of stereolithography. In addition, the present invention provides systems and methods for making a contact lens for a specific patient based on the prescription.

BACKGROUND

It is well known that contact lenses can be used for cosmetics and the correction of visual acuity. The ideal contact lens is one which is not only comfortable to wear for extended periods of time, but also easily manufactured at minimum cost.

Currently, a casting molding process is one of the most cost-effective manufacturing processes for production of contact lenses. A number of lens-molding processes have been reported, for example, PCT patent application no. WO/87/04390 or in EP-A 0 367 513. In a typical molding process, a predetermined amount of a polymerizable or crosslinkable material is dispensed in the female mold half of a mold and the mold is closed by placing the male mold half proximately to the female mold half to create a cavity having a desired geometry for a contact lens. Normally, a surplus of polymerizable or crosslinkable material is used so that when the male and female halves of the mold are closed, the excess amount of the material is expelled out into an overflow area adjacent to the mold cavity. The polymerizable or crosslinkable material remaining within the mold is polymerized or cross-linked with the delivery of radiation thereto through UV light, heat action, or other non-thermal methods. Since the geometry of the ophthalmic lens is specifically defined by the cavity between the male and female mold halves and since the geometry of the edge of the ophthalmic lens is defined by the contour of the two mold halves in the area where they make contact, a contact lens is manufactured into a final form between typically male and female mold halves, with no additional finishing work on the surface of the lens or the edges of the lens. Such full-mold process can reduce cost in the production of contact lenses.

However, In a typical molding process, a contact lens, which is removed from the mold after curing, needs to undergo the other manufacturing processes such as hydration/extraction and sterilization, which can increase manufacturing cost of contact lenses. To overcome this problem, an improved contact lens-molding process is developed and described in U.S. Pat. Nos. 5,508,317, 5,583,463, 5,789,464, and 5,849,810. By using a prepolymer which is a water-soluble photo-crosslinkable polyvinyl alcohol, a finished lens of optical quality can be produced in a mold within a few seconds without the necessity for subsequent extraction or finishing steps to the contact lens. With such manufacturing process, contact lenses can be manufactured at a reduced cost and thus it is possible to produce disposable contact lenses that are discarded by the user after a single use.

Although each of contact lens-molding processes in the prior art is able to reduce manufacturing cost of contact lenses to some extends, cost associated with molds and production thereof can be relatively high. Partly because of the relatively-high cost associated with use of molds and partly because of difficulty in managing an inventory with a huge number of SKUs, a family of contact lenses made by a lens molding process generally can only have a limited number of variations in optical power and/or choices of base curve and/or the like. In most cases, a patient has to use contact lenses which would have closes match to his (her) prescription or use customized contact lenses which are expensively produced, for example by lathing.

Moreover, in a typical molding process, the dispensing of a predetermined amount of a polymerizable or crosslinkable material into one of the two mold halves could be a challenging manufacturing issue. For example, the viscosity of the polymerizable or crosslinkable material has to be within a certain specific value so that it would be possible to dispense the polymerizable or crosslinkable material at a reasonable cost. Also, one has to take all possible measures to eliminate the formation of bubbles during dispensing of the polymerizable or crosslinkable material. All the above-stated manufacturing issues and others related to dispensing of the polymerizable or crosslinkable material can increase the cost for producing contact lenses and also limit the choices of available polymerizable or crosslinkable material for making contact lenses.

Therefore, there still exists a need for a new method for economically producing contact lenses without using molds. There also exists a need for a cost effective method of producing customized contact lenses.

SUMMARY OF THE INVENTION

One object of the invention is to provide a new method for manufacturing contact lenses and other ophthalmic devices without use of molds.

Another object of the invention is to provide a lens production process that can be easily adapted to making a customized contact lens in a cost-effective manner.

A still object of the invention is to provide a lens production process that can be easily adapted to the remote production of a contact lens or an ophthalmic device other than contact lens, preferably a customized contact lens, for example a made-by-order, cost-effective process for producing a customized contact lenses.

A further object of the invention is to provide a system for producing a contact lens, preferably a customized contact lens, according to a cost effective process.

These and other objects of the invention are met by the various aspects of the invention described herein.

The invention, in one aspect, provides a method for producing an ophthalmic device by means of stereolithography. The method comprises the steps of: depositing (i) an essentially solvent-free liquid or melt of a device-forming material, or (ii) a solution of said device-forming material, into a container, wherein said device-forming material is crosslinkable or polymerizable by actinic radiation; irradiating said device forming material with one or more activation energy beams to obtain a cured layer of polymerized or crosslinked device-forming material; irradiating said device-forming material with said one or more activation energy beams to obtain a cured layer on top of a previously cured layer; and repeating step (c) to obtain additional cured layers until said ophthalmic device is created integrally, wherein each of cured layers corresponds to a pertinent slice of said ophthalmic device.

The invention, in another aspect, provides a method for producing an ophthalmic lens for a specific patient, comprising the steps of: receiving a prescription comprising a set of characteristic data of an eye of said patient; designing a 3-D mathematical model of the ophthalmic lens based on the prescription; mathematically slicing the 3-D mathematical model into a number of thin and vertically superimposed layers, each layer having a defined thickness profile and a geometry corresponding to a cross-section of the 3-D mathematical model at the level of that layer; and converting the thickness profile and the geometry of each of a number of the thin and vertically superimposed layers into control signals that control a stereolithography machine to create, layer by superimposed layer, the ophthalmic lens in a bath of a crosslinkable or polymerizable device-forming material.

The invention, in still another aspect, provides a system for producing an ophthalmic lens for a specific patient, comprising: a computer system; a means in communication with said computer system for prompting the patient or his eye care-practitioner, who takes care of the patient, to enter the prescription of an eye of the patient; a means for designing a 3-D mathematical model of the ophthalmic lens based on the prescription; a means for mathematically slicing the 3-D mathematical model into a number of thin and vertically superimposed layers, each layer having a defined thickness profile and a geometry corresponding to a cross-section of the 3-D mathematical model at the level of that layer; a means for converting the thickness profile and the geometry of each of a number of the thin and vertically superimposed layers into control signals that control a stereolithography machine to create, layer by superimposed layer, the ophthalmic lens in a bath of a crosslinkable or polymerizable device-forming material.

The invention, in a further aspect, provides a computer program product for use in a computer system to produce an ophthalmic lens by means of stereolithography, comprising: a recording medium; means, recorded on the recording medium, for designing a 3-D mathematical model of the ophthalmic lens based on the prescription of an eye of a patient; means, recorded on the recording medium, for mathematically slicing the 3-D mathematical model into a number of thin and vertically superimposed layers, each layer having a defined thickness profile and a geometry corresponding to a cross-section of the 3-D mathematical model at the level of that layer; and means, recorded on the recording medium, for converting the thickness profile and the geometry of each of a number of the thin and vertically superimposed layers into control signals that control a stereolithography machine to create, layer by superimposed layer, the ophthalmic lens in a bath of a crosslinkable or polymerizable device-forming material.

The present invention provides the foregoing and other features, and the advantages of the invention will become further apparent from the following detailed description of the presently preferred embodiments, read in conjunction with the accompanying figures. The detailed description and figures are merely illustrative of the invention and do not limit the scope of the invention, which is defined by the appended claims and equivalents thereof.

DETAILED DESCRIPTION OF THE PREFERRED EMBODIMENTS

Reference now will be made in detail to the embodiments of the invention. It will be apparent to those skilled in the art that various modifications and variations can be made in the present invention without departing from the scope or spirit of the invention. For instance, features illustrated or described as part of one embodiment, can be used on another embodiment to yield a still further embodiment. Thus, it is intended that the present invention cover such modifications and variations as come within the scope of the appended claims and their equivalents. Other objects, features and aspects of the present invention are disclosed in or are obvious from the following detailed description. It is to be understood by one of ordinary skill in the art that the present discussion is a description of exemplary embodiments only, and is not intended as limiting the broader aspects of the present invention.

Unless defined otherwise, all technical and scientific terms used herein have the same meaning as commonly understood by one of ordinary skill in the art to which this invention belongs. Generally, the nomenclature used herein and the laboratory procedures are well known and commonly employed in the art. Conventional methods are used for these procedures, such as those provided in the art and various general references. Where a term is provided in the singular, the inventors also contemplate the plural of that term. The nomenclature used herein and the laboratory procedures described below are those well known and commonly employed in the art.

The present invention is generally related to a new method for producing a contact lens or an ophthalmic device other than contact lens. Unlike any methods known in the prior art for producing an ophthalmic device, a method of the invention does not involve use of molds and/or lathe in producing an ophthalmic device. According to a method of the invention, a stereolithography apparatus (machine) is used to produce an ophthalmic device, preferably a contact lens or a customized contact lens.

An "ophthalmic device", as used herein, refers to a contact lens (hard or soft), an intraocular lens, a corneal onlay, and other ophthalmic devices (e.g., stents, implants, or the like) used on or about the eye or ocular vicinity.

Stereolithography, as conventionally practiced, involves building, layer by superimposed layer, a three-dimensional (3-D) object, based on a 3-D mathematical model of an object generated by a computer. The 3-D mathematical model is typically generated with the help of 3-D computer-aided design (CAD) software. The model is mathematically separated or "sliced" into a large number of relatively thin and vertically superimposed layers, each layer having a defined thickness profile and a geometry corresponding to a cross-section of the model at the level of that layer. The geometry of each layer defines boundaries and other features associated with the model at the level of that layer within the exterior boundaries of that object.

There are a wide approaches to stereolithography depending upon a material employed to fabricate an object. A preferred stereolithography technique is based on polymerization and solidification of a liquid material by actinic irradiation (e.g., a UV laser) one layer at a time. For example, a focused ultra-violet (UV) laser scans over the top of a bath of a photopolymerizable liquid material following a pattern under control of a computer or controller. The UV laser causes the bath to polymerize where the laser beam strikes the surface of the bath, resulting in the formation of a first solid plastic layer at and just below the surface. The solid layer is then lowered into the bath and the laser-initiated polymerization process is repeated for the generation of the next layer, and so on, until a plurality of superimposed layers is obtained.

Each of the solid plastic layers is a "reprint" of a corresponding "slice" (cross-section) of a 3-D mathematical model (design) of an object.

The present invention, in one aspect, provides a method for producing an ophthalmic device by means of stereolithography. The method comprises: (a) depositing (i) an essentially solvent-free liquid or melt of a device-forming material, or (ii) a solution of said device-forming material, into a container, wherein said device-forming material is crosslinkable or polymerizable by actinic radiation; (b) irradiating said device forming material with one or more activation energy beams to obtain a cured layer of polymerized or crosslinked device-forming material; (c) irradiating said device-forming material with said one or more activation energy beams to obtain a cured layer on top of a previously cured layer; (d) repeating step (c) to obtain additional cured layers until said ophthalmic device is created integrally, wherein each of cured layers corresponds to a pertinent slice of said ophthalmic device.

In accordance with the present invention, a crosslinkable or polymerizable device-forming material (hereinafter referred to device-forming material) may be any of a wide variety of materials which can be polymerized and/or crosslinked by actinic radiation to obtain crosslinked materials which are ophthalmically compatible. Such device-forming materials can be any materials known to a skilled artisan. For example, a device-forming material can be a composition consisting of primarily various monomers and/or macromers and optionally further including various components, such as photoinitiator, inhibitors, fillers, and the like.

"Ophthalmically compatible", as used herein, refers to a material or surface of a material which may be in intimate contact with the ocular environment for an extended period of time without significantly damaging the ocular environment and without significant user discomfort. Thus, an ophthalmically compatible contact lens will not produce significant corneal swelling, will adequately move on the eye with blinking to promote adequate tear exchange, will not have substantial amounts of protein or lipid adsorption, and will not cause substantial wearer discomfort during the prescribed period of wear.

"Ocular environment", as used herein, refers to ocular fluids (e.g., tear fluid) and ocular tissue (e.g., the cornea) which may come into intimate contact with a contact lens used for vision correction, drug delivery, wound healing, eye color modification, or other ophthalmic applications.

A "monomer" means a low molecular weight compound that can be polymerized. Low molecular weight typically means average molecular weights less than 700 Daltons.

A "macromer" refers to a medium and high molecular weight compound or polymer that contains functional groups capable of further polymerization. Medium and high molecular weight typically means average molecular weights greater than 700 Daltons.

Any suitable photoinitiator known to a person skilled in the art can be incorporated in a crosslinkable or polymerizable device-forming material. Exemplary photoinitiators are benzoin-methylether, 1-hydroxy-cyclo-hexyl-phenylketone, Darocure® 1173 or Irgacure® types.

A solution of a device-forming material can be prepared by dissolving the device-forming in any suitable solvent known to a person skilled in the art. Examples of suitable solvents are water, alcohols, such as lower alkanols, for example ethanol or methanol, and furthermore carboxylic acid amides, such as dimethylformamide, dipolar aprotic solvents, such as dimethyl sulfoxide or methyl ethyl ketone, ketones, for example acetone or cyclohexanone, hydrocarbons, for example toluene, ethers, for example THF, dimethoxyethane or dioxane, and halogenated hydrocarbons, for example trichloroethane, and also mixtures of suitable solvents, for example mixtures of water with an alcohol, for example a water/ethanol or a water/methanol mixture.

A preferred group of device-forming materials are ophthalmically compatible prepolymers which are water-soluble and/or meltable. It would be advantageous that a device-forming material comprises primarily one or more prepolymers which are preferably in a substantially pure form (e.g., purified by ultrafiltration). Therefore, after crosslinking by actinic radiation, an ophthalmic device may require practically no more subsequent purification, such as in particular complicated extraction of unpolymerized constituents. Furthermore, crosslinking may take place solvent-free or in aqueous solution, so that a subsequent solvent exchange or the hydration step is not necessary.

A "prepolymer" refers to a starting polymer which can be crosslinked upon actinic radiation to obtain a crosslinked polymer having a molecular weight much higher than the starting polymer. Examples of actinic radiation are UV irradiation, ionized radiation (e.g. gamma ray or X-ray irradiation), microwave irradiation, and the like.

A "polymer" means a material formed by polymerizing one or more monomers.

One example of a preferred prepolymer is a water-soluble crosslinkable poly(vinyl alcohol)prepolymer. More preferably, a water-soluble crosslinkable poly(vinyl alcohol)prepolymer is a polyhydroxyl compound which is described in U.S. Pat. No. 5,583,163 (incorporated by reference in its entirety) and U.S. Pat. No. 6,303,687 (incorporated by reference in its entirety) and has a molecular weight of at least about 2000 and which comprises from about 0.5 to about 80%, based on the number of hydroxyl groups in the poly(vinyl alcohol), of units of the formula I, I and II, I and III, or I and II and III A "molecular weight", as used herein, refers to a weight average molecular weight, Mw, determined by gel permeation chromatography, unless otherwise specified.

In formula I, II and III, $R_3$ is hydrogen, a $C_1$-$C_6$ alkyl group or a cycloalkyl group.

In formula I, II and III, R is alkylene having up to 12 carbon atoms, preferably up to 8 carbon atoms, and can be linear or branched. Suitable examples include octylene, hexylene, pentylene, butylene, propylene, ethylene, methylene, 2-propylene, 2-butylene and 3-pentylene. Lower alkylene R preferably has up to 6, particularly preferably up to 4 carbon atoms. Methylene and butylene are particularly preferred.

In the formula I, $R_1$ is hydrogen or lower alkyl having up to seven, in particular up to four, carbon atoms. Most preferably, $R_1$ is hydrogen.

In the formula I, $R_2$ is an olefinically unsaturated, electron-withdrawing, crosslinkable radical, preferably having up to 25 carbon atoms. In one embodiment, $R_2$ is an olefinically unsaturated acyl radical of the formula $R_4$—CO—, in which $R_4$ is an olefinically unsaturated, crosslinkable radical having 2 to 24 carbon atoms, preferably having 2 to 8 carbon atoms, particularly preferably having 2 to 4 carbon atoms.

The olefinically unsaturated, crosslinkable radical $R_4$ having 2 to 24 carbon atoms is preferably alkenyl having 2 to 24 carbon atoms, in particular alkenyl having 2 to 8 carbon atoms, particularly preferably alkenyl having 2 to 4 carbon atoms, for example ethenyl, 2-propenyl, 3-propenyl, 2-butenyl, hexenyl, octenyl or dodecenyl. Ethenyl and 2-propenyl are preferred, so that the —CO—$R_4$ group is the acyl radical of acrylic acid or methacrylic acid.

In another embodiment, the radical $R_2$ is a radical of the formula IV, preferably of the formula V —CO—NH—($R_5$—NH—CO—O)$_q$—$R_6$—O—CO—$R_4$   (IV)

—[CO—NH—($R_5$—NH—CO—O)$_q$—$R_6$—O]$_p$—CO—$R_4$   (V)

in which p and q, independently of one another, are zero or one, and $R_5$ and $R_6$, independently of one another, are lower alkylene having 2 to 8 carbon atoms, arylene having 6 to 12 carbon atoms, a saturated bivalent cycloaliphatic group having 6 to 10 carbon atoms, arylenealkylene or alkylenearylene having 7 to 14 carbon atoms or arylenealkylenearylene having 13 to 16 carbon atoms, and in which $R_4$ is as defined above.

Lower alkylene $R_5$ or $R_6$ preferably has 2 to 6 carbon atoms and is, in particular, linear. Suitable examples include propylene, butylene, hexylene, dimethylethylene and, particularly preferably, ethylene.

Arylene $R_5$ or $R_6$ is preferably phenylene, which is unsubstituted or substituted by lower alkyl or lower alkoxy, in particular 1,3-phenylene or 1,4-phenylene or methyl-1,4-phenylene.

A saturated bivalent cycloaliphatic group $R_5$ or $R_6$ is preferably cyclohexylene or cyclohexylene(lower alkylene), for example cyclohexylenemethylene, which is unsubstituted or substituted by one or more methyl groups, for example trimethylcyclohexylenemethylene, for example the bivalent isophorone radical.

The arylene unit of alkylenearylene or arylenealkylene $R_5$ or $R_6$ is preferably phenylene, unsubstituted or substituted by lower alkyl or lower alkoxy, and the alkylene unit thereof is preferably lower alkylene, such as methylene or ethylene, in particular methylene. Radicals $R_5$ or $R_6$ of this type are therefore preferably phenylenemethylene or methylenephenylene.

Arylenealkylenearylene $R_5$ or $R_6$ is preferably phenylene(lower alkylene)phenylene having up to 4 carbon atoms in the alkylene unit, for example phenyleneethylenephenylene.

The radicals $R_5$ and $R_6$ are preferably, independently of one another, lower alkylene having 2 to 6 carbon atoms, phenylene, unsubstituted or substituted by lower alkyl, cyclohexylene or cyclohexylene(lower alkylene), unsubstituted or substituted by lower alkyl, phenylene(lower alkylene), (lower alkylene)phenylene or phenylene(lower alkylene)phenylene.

In the formula II, $R_7$ is a primary, secondary or tertiary amino group or a quaternary amino group of the formula $N^+(R')_3X^-$, in which each R', independently of the others, is hydrogen or a $C_1$-$C_4$ alkyl radical and X is a counterion, for example $HSO_4^-$, $F^-$, $Cl^-$, $Br^-$, $I^-$, $CH_3COO^-$, $OH^-$, $BF^-$, or $H_2PO_4^-$.

The radicals $R_7$ are, in particular, amino, mono- or di(lower alkyl)amino, mono- or diphenylamino, (lower alkyl)phenylamino or tertiary amino incorporated into a heterocyclic ring, for example —$NH_2$, —NH—$CH_3$, —N($CH_3$)$_2$, —NH($C_2H_5$), —N($C_2H_5$)$_2$, —NH(phenyl), —N($C_2H_5$)phenyl or In the formula III, $R_8$ is the radical of a monobasic, dibasic or tribasic, saturated or unsaturated, aliphatic or aromatic organic acid or sulfonic acid. Preferred radicals $R_8$ are derived, for example, from chloroacetic acid, succinic acid, glutaric acid, adipic acid, pimelic acid, maleic acid, fumaric acid, itaconic acid, citraconic acid, acrylic acid, methacrylic acid, phthalic acid and trimellitic acid.

For the purposes of this invention, the term "lower" in connection with radicals and compounds denotes, unless defined otherwise, radicals or compounds having up to 7 carbon atoms, preferably having up to 4 carbon atoms.

Lower alkyl has, in particular, up to 7 carbon atoms, preferably up to 4 carbon atoms, and is, for example, methyl, ethyl, propyl, butyl or tert-butyl.

Lower alkoxy has, in particular, up to 7 carbon atoms, preferably up to 4 carbon atoms, and is, for example, methoxy, ethoxy, propoxy, butoxy or tert-butoxy.

The bivalent group —$R_5$—NH—CO—O— is present if q is one and absent if q is zero. Poly(vinyl alcohol)s containing crosslinkable groups in which q is zero are preferred.

The bivalent group —CO—NH—($R_5$—NH—CO—O) q—$R_6$—O— is present if p is one and absent if p is zero. Poly(vinyl alcohol)s containing crosslinkable groups in which p is zero are preferred.

In the poly(vinyl alcohol)s comprising units containing crosslinkable groups in which p is one, the index q is preferably zero. Particular preference is given to poly(vinyl alcohol)s comprising crosslinkable groups in which p is one, the index q is zero and $R_5$ is lower alkylene.

In the formula $N^+(R')_3X^-$, R' is preferably hydrogen or $C_1$-$C_3$ alkyl, and X is halide, acetate or phosphite, for example —$N^+(C_2H_5)_3CH_3COO^-$, —$N^+(C_2H_5)_3Cl^-$, and —$N^+(C_2H_5)_3H_2PO_4^-$.

A water-soluble crosslinkable poly(vinyl alcohol) according to the invention is more preferably a polyhydroxyl compound which has a molecular weight of at least about 2000 and which comprises from about 0.5 to about 80%, preferably from 1 to 50%, more preferably from 1 to 25%, even more preferably from 2 to 15%, based on the number of hydroxyl groups in the poly(vinyl alcohol), of units of the formula I, wherein R is lower alkylene having up to 6 carbon atoms, $R_1$ is hydrogen or lower alkyl, $R_3$ is hydrogen, and $R_2$ is a radical of formula (V). Where p is zero, $R_4$ is preferably $C_2$-$C_8$ alkenyl. Where p is one and q is zero, $R_6$ is preferably $C_2$-$C_6$ alkylene and $R_4$ is preferably $C_2$-$C_8$ alkenyl. Where both p and q are one, $R_5$ is preferably $C_2$-$C_6$ alkylene, phenylene, unsubstituted or lower alkyl-substituted cyclohexylene or cyclo hexylene-lower alkylene, unsubstituted or lower alkyl-substituted phenylene-lower alkylene, lower alkylene-phenylene, or phenylene-lower alkylene-phenylene, $R_6$ is preferably $C_2$-$C_6$ alkylene, and $R_4$ is preferably $C_2$-$C_8$ alkenyl.

Crosslinkable poly(vinyl alcohol)s comprising units of the formula I, I and II, I and III, or I and II and III can be prepared in a manner known per se. For example, U.S. Pat. No. 5,583,163 (incorporated by reference in its entirety) and U.S. Pat. No. 6,303,687 (incorporated by reference in its entirety) disclose and teach how to prepare crosslinkable polymers comprising units of the formula I, I and II, I and III, or I and II and III.

Another example of a preferred prepolymer according to the invention is a vinyl group-terminated polyurethane which is obtained by reacting an isocyanate-capped polyurethane with an ethylenically unsaturated amine (primary or secondary amine) or an ethylenically unsaturated monohydroxy compound. The isocyanate-capped polyurethane is a copolymerization product of (a) at least one polyalkylene glycol of formula $$HO\text{—}(R_9\text{—}O)_n\text{—}(R_{10}\text{—}O)_m\text{—}(R_{11}\text{—}O)_l\text{—}H \qquad (1)$$

wherein $R_9$, $R_{10}$, and $R_{11}$, independently of one other, are each linear or branched $C_2$-$C_4$-alkylene, and n, m and l, independently of one another, are each a number from 0 to 100, wherein the sum of (n+m+l) is 5 to 100, (b) at least one branching agent selected from the group consisting of (i) a linear or branched aliphatic polyhydroxy compound of formula $$R_{12}\text{—}(OH)_x \qquad (2),$$

wherein $R_{12}$ is a linear or branched $C_3$-$C_{18}$ aliphatic multivalent radical and x is a number $\geq 3$, (ii) a polyether polyol, which is the polymerization product of a compound of formula (2) and a glycol, (iii) a polyester polyol, which is the polymerization product of a compound of formula (2), a dicarboxylic acid or a derivative thereof and a diol, and (iv) a cycloaliphatic polyol selected from the group consisting of a $C_5$-$C_8$-cycloalkane which is substituted by $\geq 3$ hydroxy groups and which is unsubstituted by alkyl radical, a $C_5$-$C_8$-cycloalkane which is substituted by $\geq 3$ hydroxy groups and which is substituted by one ore more $C_1$-$C_4$ alkyl radicals, and an unsubstituted mono- and disaccharide, (v) an aralkyl polyol having at least three hydroxy $C_1$-$C_4$ alkyl radicals, and (c) at least one di- or polyisocyanate of formula $$R_{13}\text{—}(NCO)_y \qquad (3)$$

wherein $R_{13}$ a linear or branched $C_3$-$C_{24}$ aliphatic polyisocyanate, the radical of a $C_3$-$C_{24}$ cycloaliphatic or aliphatic-cycloaliphatic polyisocyanate, or the radical of a $C_3$-$C_{24}$ aromatic or araliphatic polyisocyanate, and y is a number from 2 to 6.

The isocayanate-capped polyurethane polymers according to the invention may be produced by following a solventless process. For example, in a solventless process, first one or more polyalkylene glycols of formula (1) (component (a)) is mixed with one or more branching agents (component (b)) and the mixture is heated to and maintained at a melting temperature or above. Then, at least one di- or polyisocyanate of formula (3) (component (c)) is added to the melted mixture to make a melted reaction mixture comprising component (a), component (b) and component (c) in a desired stoichiometry. The temperature of the melted reaction mixture is continuously and thoroughly stirred at the melting temperature or above and preferably under an inert atmosperic environment (for example, in nitrogen or argon atmosphere). Reaction is monitored by, for example, monitoring the isocyanate peak in FT-IR spectroscopy. Components (a)-(c) are all known compounds or compound mixtures, or may be obtained in accordance with methods known per se.

A further example of a preferred prepolymer is a crosslinkable polyurea prepolymer as described in European patent No. 1,017,734. The crosslinkable polyurea prepolymer can be obtained by reacting an acryloylchloride or an isocyanate group-containing carylate or methacrylate with a polymerization product of $NH_2$-terminated polyalkylene glycols and di- or polyisocyanates optionally in the presence of a triamine.

Other exemplary preferred prepolymers include: crosslinkable statistical copolymers of vinyl lactam, MMA and a comonomer, which are disclosed in EP 655,470 and U.S. Pat. No. 5,712,356 (incorporated by reference in its entirety); crosslinkable copolymers of vinyl lactam, vinyl acetate and vinyl alcohol, which are disclosed in EP 712,867 and U.S. Pat. No. 5,665,840 (incorporated by reference in its entirety); polyether-polyester copolymers with crosslinkable side chains which are disclosed in EP 932,635; branched polyalkylene glycol-urethane prepolymers disclosed in EP 958,315 and U.S. Pat. No. 6,165,408 (incorporated by reference in its entirety); polyalkylene glycol-tetra(meth)acrylate prepolymers disclosed in EP 961,941 and U.S. Pat. No. 6,221,303 (incorporated by reference in its entirety); and crosslinkable polyallylamine gluconolactone prepolymers disclosed in PCT patent application WO 2000/31150.

In accordance with a preferred embodiment of the invention, a device-forming material is composed of primarily one or more prepolymers and optionally additional vinylic monomers. Crosslinking or polymerizing is preferably effected whilst solvent-free or essentially solvent-free or directly from an aqueous solution. The prepolymer is preferably in a substantially pure form, for example, as obtained by a purification step, such as ultrafiltration. For example, crosslinking or polymerizing may be undertaken from an aqueous solution containing about 15 to 90% of one or more prepolymers.

The vinylic monomer which may be additionally used for photo-crosslinking or polymerizing in accordance with the invention may be hydrophilic, hydrophobic or may be a mixture of a hydrophobic and a hydrophilic vinylic monomer. Suitable vinylic monomers include especially those normally used for the manufacture of contact lenses. A "hydrophilic vinylic monomer" refers to a monomer which as a homopolymer typically yields a polymer that is water-soluble or can absorb at least 10 percent by weight water. A "hydrophobic vinylic monomer" refers to a monomer which as a homopolymer typically yields a polymer that is insoluble in water and can absorb less than 10 percent by weight water.

It is preferable to use a hydrophobic vinylic monomer, or a mixture of a hydrophobic vinylic monomer with a hydrophilic vinylic monomer, whereby this mixture contains at least 50 percent by weight of a hydrophobic vinyl comonomer. In this way, the mechanical properties of the resultant polymer may be improved without the water content dropping substantially. Both conventional hydrophobic vinylic monomers and conventional hydrophilic vinylic monomers are suitable for copolymerization with the prepolymers.

Suitable hydrophobic vinylic monomers include, without limitation, $C_1$-$C_{18}$-alkylacrylates and -methacrylates, $C_3$-$C_{18}$ alkylacrylamides and -methacrylamides, acrylonitrile, methacrylonitrile, vinyl-$C_1$-$C_{18}$-alkanoates, $C_2$-$C_{18}$-alkenes, $C_2$-$C_{18}$-halo-alkenes, styrene, $C_1$-$C_6$-alkylstyrene, vinylalkylethers in which the alkyl moiety has 1 to 6 carbon atoms, $C_2$-$C_{10}$-perfluoralkyl-acrylates and -methacrylates or correspondingly partially fluorinated acrylates and methacrylates, $C_3$-$C_{12}$-perfluoralkyl-ethyl-thiocarbonylaminoethyl-acrylates and -methacrylates, acryloxy and methacryloxy-alkyl-siloxanes, N-vinylcarbazole, $C_1$-$C_{12}$-alkylesters of maleic acid, fumaric acid, itaconic acid, mesaconic acid and the like. Preference is given e.g. to $C_1$-$C_4$-alkylesters of vinylically unsaturated carboxylic acids with 3 to 5 carbon atoms or vinylesters of carboxylic acids with up to 5 carbon atoms.

Examples of suitable hydrophobic vinylic monomers include methylacrylate, ethyl-acrylate, propylacrylate, isopropylacrylate, cyclohexylacrylate, 2-ethylhexylacrylate, methylmethacrylate, ethylmethacrylate, propylmethacrylate, vinyl acetate, vinyl propionate, vinyl butyrate, vinyl valerate, styrene, chloroprene, vinyl chloride, vinylidene chloride, acrylonitrile, 1-butene, butadiene, methacrylonitrile, vinyl toluene, vinyl ethyl ether, perfluorohexylethyl-thio-carbonyl-aminoethyl-methacrylate, isobornyl methacrylate, trifluoroethyl methacrylate, hexafluoro-isopropyl methacrylate, hexafluorobutyl methacrylate, tris-trimethylsilyloxy-silylpropyl methacrylate, 3-methacryloxypropyl-pentamethyl-disiloxane and bis(methacryloxypropyl)-tetramethyl-disiloxane.

Suitable hydrophilic vinylic monomers include, without limitation, hydroxy-substituted lower alkylacrylates and -methacrylates, acrylamide, methacrylamide, lower alkyl-acrylamides and -methacrylamides, ethoxylated acrylates and methacrylates, hydroxy-substituted lower alkyl-acrylamides and -methacrylamides, hydroxy-substituted lower alkylvinyl-ethers, sodium ethylene sulphonate, sodium styrene sulphonate, 2-acrylamido-2-methyl-propane-sulphonic acid, N-vinyl pyrrole, N-vinyl succinimide, N-vinyl pyrrolidone, 2- or 4-vinyl pyridine, acrylic acid, methacrylic acid, amino- (whereby the term "amino" also includes quaternary ammonium), mono-lower-alkylamino- or di-lower-alkylamino-lower-alkyl-acrylates and -methacrylates, allyl alcohol and the like. Preference is given e.g. to hydroxy-substituted $C_2$-$C_4$-alkyl(meth)acrylates, five- to seven-membered N-vinyl-lactams, N,N-di-$C_1$-$C_4$-alkyl-methacrylamides and vinylically unsaturated carboxylic acids with a total of 3 to 5 carbon atoms.

Examples of suitable hydrophilic vinylic monomers include hydroxyethyl methacrylate, hydroxyethyl acrylate, acrylamide, methacrylamide, dimethylacrylamide, allyl alcohol, vinyl pyridine, vinyl pyrrolidone, glycerol methacrylate, N-(1,1-dimethyl-3-oxobutyl)acrylamide, and the like.

Preferred hydrophobic vinylic monomers are methyl methacrylate and vinyl acetate. Preferred hydrophilic vinylic comonomers are 2-hydroxyethyl methacrylate, N-vinyl pyrrolidone and acrylamide.

In accordance with the invention, each of cured layers (solidified plastic or hydrogel layers) is preferably have a thickness of less than about 20 mils (mili-inches), more preferably less than about 10 mils, even more preferably less than 6 mils, most preferably less than 4 mils.

The thickness of a cure layer is largely controlled by two properties of a device-forming material, the critical exposure ($E_c$) and the depth of penetration ($D_p$).

$E_c$ is defined as the minimum amount of exposure to cause a sufficient number of reactions to form gel. Exposure (E) is defined as the amount of energy striking a surface and measured in term of energy/area (joules/cm$^2$). $E_c$ is material and wavelength dependent. If a device-forming material receives more exposure than $E_c$, the gelled mass polymerized more and the mass becomes stronger until the point is reached that sufficient exposure has been given to complete the polymerization process. $E_c$ of a device-forming material can be changed by adding one or more photoinitiators or radical scavengers (inhibitors).

$D_p$ is the depth of a device-forming material into which an actinic radiation can penetrate. The depth of penetration is inversely related to a device-forming material's ability to absorb radiation and is generally wavelength dependent. The depth of penetration of a device-forming material can be adjusted by adding one or more UV absorbing agents. By increasing the concentration of a UV absorbing agent in a device-forming material, the depth of penetration can be decreased.

In accordance with the invention, the thickness of a cure layer can be controlled by the combination of these two properties of a device-forming material. For example, where a device-forming material has a relatively large $D_p$, a laser beam can scan the bath surface at a relatively higher speed to obtain a thinner cured layer, since exposure does not cause polymerization but absorption of appropriate radiation from the exposing radiation causes polymerization in a volume of device-forming material. An actinic radiation becomes more and more attenuated as it goes deeper and deeper into the device-forming material, the upper level (at the bath surface and just below the surface) receives greater intensity, and thus great exposure, than the lower level. Thus, the upper levels will gel whereas the device-forming material at lower levels has not yet gelled.

In a preferred embodiment, a device-forming material comprises at least one UV absorbing agent at a concentration sufficient to reduce the depth of penetration of the device-forming material to a desired $D_p$. It is advantageous to add UV absorbing agents to a device-forming material. This can incorporate the UV absorbing agents into the resultant contact lens or intraocular lens, as is known in the art. UV absorbing agents are capable of minimizing the UV-associated damage to an eye. Exemplary UV absorbing agents include, but are not limited to, 4-methacryloxy 2-hydroxybenzophenone (MOBP), 2-(3'-methallyl-2'-hydroxy-5'-methyl phenyl)benzotriazole, substituted 2-hydroxybenzophenones, 2-hydroxy-5-acryloxyphenyl-2H-benzotriazoles, and the like.

Activation energy beams can be electron beams, X-rays, or preferably UV or visible lights. Suitable light sources include, but are not limited to, He:Cd laser, argon-ion laser, nitrogen laser, metal vapor laser, Nd:YAG laser. A laser can produce a single line at one wavelength lines or several lines at several wavelengths. For example, commercial HeCd lasers produce a single wavelength line at 325 nm. A commercial argon-ion laser can be set to lase in the UV region at a variety of single wavelength or at several wavelengths simultaneously. The primary UV lines for the argon-ion laser are at approximately 364 nm, 252 nm, and 334 nm, and others. The laser can be set to lase at all these wavelengths simultaneously with power outputs of about 40%, 40%, and 20% for the 364 nm line, the 351 nm line, and 334 nm line/other lines respectively.

In another preferred embodiment of the invention, two activation energy beams are employed to obtain cured layers, wherein these energy beams have different wavelengths and can produce two different values of depth of penetration of a device-forming material. An energy beam, which produces a smaller $D_p$ value, is used to scan the peripheral edges of a layer to minimize the spacing of stair steps, so that an ophthalmic device with a relatively smooth surface can be obtained. Alternatively, two identical energy beams, a first and a second beams, can be used in a method of the invention. The first beam strikes perpendicularly the surface of the bath of a device-forming material, and the second beam strikes the surface at a angle, for example, at 45 degree, or at a angle so that the second beam is substantially tangent to the surface of the ophthalmic device. The second beams is used to form the peripheral edges of a cured layer so that an ophthalmic device with a relatively smooth surface can be obtained.

Scanning of an energy beam over the surface of the bath is controlled by a computer or controller to follow a desired pattern. Such computer control is typically effected by control signals, which are converted from a 3-D mathematical model of an ophthalmic device. The conversion process involves mathematically separating or "slicing" the 3-D mathematical model into a large number of relatively thin and vertically superimposed layers, each layer having a defined thickness profile and a geometry corresponding to a cross-section of the model at the level of that layer.

Typically, a 3-D mathematical model of an ophthalmic device is generated with the help of a CAD software. A person skilled in the art knows how to design an ophthalmic device and then construct the mathematical surfaces of the design to obtain the 3-D mathematical model. For example, a contact lens having any surface designs including non-rotationally-symmetric surfaces can be designed by using an optical computer aided design (CAD) system and a mechanical CAD system.

An optical CAD system is used to design an optical model lens. "An optical model lens" refers to a contact lens that is designed in a computer system and generally does not contain other non-optical systems which are parts of the contact lens. Exemplary non-optical systems of a contact lens include, but are not limited to bevel, lenticular, and edge that joins the anterior and posterior surfaces of a contact lens.

"A bevel" refers to a non-optical surface zone located at the edge of the posterior surface of a contact lens. Generally, the bevel is a significantly flatter curve and is usually blended with the base curve (optical posterior surface) of a contact lens and appears as an upward taper near the edge. This keeps the steeper base curve radius from gripping the eye and allows the edge to lift slightly. This edge lift is important for the proper flow of tears across the cornea and makes the lens fit more comfortably.

"A lenticular" refers to a non-optical surface zone of the anterior surface of a contact lens between the optical zone and the edge. The primary function of the lenticular is to control the thickness of the lens edge.

Any known, suitable optical computer aided design (CAD) system may be used to design an optical model lens. Exemplary optical computer aided design systems includes, but are not limited to Advanced System Analysis program (ASAP) from Breault Research Organization and ZEMAX (Focus Software, Inc.). Preferably, the optical design will be performed using Advanced System Analysis program (ASAP) from Breault Research Organization with input from ZEMAX (Focus Software, Inc.).

The design of the optical model lens can be transformed by, for example, a mechanical CAD system, into a mechanical lens design that includes optical zones, non-optical zones and non-optical features. Exemplary non-optical zones and features of a contact lens include, but are not limited to bevel, lenticular, edge that joins the anterior and posterior surfaces of a contact lens, orientation features, and the like. Exemplary orientation features include, but are not limited to, a prism ballast or the like that uses a varying thickness profile to control the lens orientation, a faceted surface (e.g., ridge-off zone) in which parts of the lens geometry is removed to control the lens orientation, a ridge feature which orients the lens by interacting with the eyelid. Preferably, when transforming the design of an optimized optical model lens into a mechanical lens design, some common features of a family of contact lenses can be incorporated.

Any known, suitable mechanical CAD system can be used in the invention. Preferably, a mechanical CAD system capable of representing precisely and mathematically high order surfaces is used to design a contact lens. An example of such mechanical CAD system is Pro/Engineer.

Preferably, the design of a contact lens may be translated back and forth between the optical CAD and mechanical CAD systems using a translation format which allows a receiving system, either optical CAD or mechanical CAD, to construct NURBs or Beizier surfaces of an intended design. Exemplary translation formats include, but are not limited to, VDA (verband der automobilindustrie) and IGES (Initial Graphics Exchange Specification). By using such translation formats, overall surface of lenses can be in a continuous form that facilitates the production of lenses having radially asymmetrical shapes.

Any mathematical function can be used to describe the anterior surface, posterior surface, peripheral edge of an ophthalmic lens, as long as they have sufficient dynamic range which allow the design of that lens to be optimized. Exemplary mathematical functions include conic and quadric functions, polynomials of any degree, Zernike polynomials, exponential functions, trigonometric functions, hyperbolic functions, rational functions, Fourier series, and wavelets. Preferably, a combination of two or more mathematical functions are used to describe the front (anterior) surface and base (posterior) surface of an ophthalmic lens. More preferably, Zernike polynomials are used to describe the front (anterior) surface and base (posterior) surface of an ophthalmic lens. Even more preferably, Zernike polynomials and spline-based mathematical functions are used together to describe the front (anterior) surface and base (posterior) surface of an ophthalmic lens.

After the optical and mechanical design for a contact lens is completed, a lens design (a 3-D mathematical model) is typically in a neutral file format, for example, such as IGES or VDA, or in a proprietary file format (for example, a Pro/E file format). The lens design is then mathematically separated or sliced into a large number of thin and vertically superimposed layers, each layer having a defined thickness profile and a geometry corresponding to a cross-section of the lens model at the level of that layer. Then, the thickness profile and the geometry of each of a number of the thin and vertically superimposed layers are converted into control signals which will control activation energy beams to print, one at a time, each of a number of the thin and vertically superimposed layers. "Vertically" in reference to a contact lens means a direction parallel to the central axis of the contact lens. The central axis of a contact lens refers to a line that passes through the apex of the anterior surface (convex curvature surface) of the contact lens in a normal direction to the surface.

Any stereolithography machine can be used in the method of the invention. Currently, a number of stereolithography machines are commercially available, for example, from 3D Systems, TECH, Inc., etc.

What is notable about a method of the invention is that the contact lenses according to the invention can be produced from a crosslinkable or polymerizable device-forming material in a very simple and efficient way compared with the prior art. This is based on many factors. On the one hand, no mold or lathe is involved in the production. The cost associated with molds can be eliminated. Secondly, there is no stringent manufacturing requirements related to dispensing of essentially solvent-free liquid or melt of a device-forming material or of a solution of said device-forming material. The solution or essentially solvent-free liquid or melt of a device-forming material can have a wide range of viscosity.

It would be advantageous that a device-forming material comprises primarily one or more prepolymers which are preferably in a substantially pure form (e.g., purified by ultrafiltration). Therefore, after crosslinking by actinic radiation, an ophthalmic device may require practically no more subsequent purification, such as in particular complicated extraction of unpolymerized constituents. Furthermore, crosslinking may take place solvent-free or in aqueous solution, so that a subsequent solvent exchange or the hydration step is not necessary.

What is also notable about the method of the invention is that, together with a communication network, such as the Internet, a method of the invention based on stereolithgraphy can be easily and economically implemented to produce a customized contact lens or to produce any contact lens in a remote location, for example, in the office of an eye-doctor or decentralized production facilities. It is also conducive to conduct electronic business involving ordering, making and delivering of contact lenses.

A "customized contact lens" refers to a contact lens made by order.

The Internet comprises a vast number of computers and computer networks that are interconnected through communication links. The interconnected computers exchange information using various services, such as electronic mail, Gopher, and the World Wide Web ("WWW"). The WWW service allows a server computer system (i.e., Web server or Web site) to send graphical Web pages of information to a remote client computer system. The remote client computer system can then display the Web pages. Each resource (e.g., computer or Web page) of the WWW is uniquely identifiable by a Uniform Resource Locator ("URL"). To view a specific Web page, a client computer system specifies the URL for that Web page in a request (e.g., a HyperText Transfer Protocol ("HTTP") request). The request is forwarded to the Web server that supports that Web page. When that Web server receives the request, it sends that Web page to the client computer system. When the client computer system receives that Web page, it typically displays the Web page using a browser. A browser is a special-purpose application program that effects the requesting of Web pages and the displaying of Web pages.

Currently, Web pages are typically defined using HyperText Markup Language ("HTML"). HTML provides a standard set of tags that define how a Web page is to be displayed. When a user indicates to the browser to display a Web page, the browser sends a request to the server computer system to transfer to the client computer system an HTML document that defines the Web page. When the requested HTML document is received by the client computer system, the browser displays the Web page as defined by the HTML document. The HTML document contains various tags that control the displaying of text, graphics, controls, and other features. The HTML document may contain URLs of other Web pages available on that server computer system or other server computer systems.

The present invention, in another aspect, provides a method for producing an ophthalmic lens for a specific patient. The method comprises: receiving a prescription comprising a set of characteristic data of an eye of said patient; designing a 3-D mathematical model of the ophthalmic lens based on the prescription; mathematically slicing the 3-D mathematical model into a number of thin and vertically superimposed layers, each layer having a defined thickness profile and a geometry corresponding to a cross-section of the 3-D mathematical model at the level of that layer; and converting the thickness profile and the geometry of each of a number of the thin and vertically superimposed layers into control signals that control a stereolithography machine to create, layer by superimposed layer, the ophthalmic lens in a bath of a crosslinkable or polymerizable device-forming material.

The prescription of an eye minimally comprises low-order aberrations of the eye, such as defocus, astigmatism and prism, and optionally the appropriate curvature of the posterior surface (concave surface). Preferably, the prescription of an eye comprises wavefront aberrations of the eye and/or corneal topography data of the eye.

The wavefront aberrations of an eye of an individual can be determined by any suitable methods known to one skilled in the art. For example, Liang et al. in J. Optical Soc. Am. 11:1-9, the entirety of which are herein incorporated by reference, teach how to determine wavefront aberrations of an eye at various pupil diameters using a Hartmann-Shack system. The wavefront aberrations generally are quantified in Zernike polynomials which are a set of functions that are orthogonal over the unit circle. Since Zernike polynomials are orthogonal, the aberrations are separable and can be treated as such. The first order Zernike modes are the linear terms. The second order Zernike modes are the quadratic terms, which correspond to the aberrations such as defocus and astigmatism. The third order Zernike modes are the cubic terms, which correspond to the coma and coma-like aberrations. The fourth order Zernike modes contain spherical aberrations as well as other modes. The fifth Zernike modes are the higher-order, irregular aberrations. Local irregularities in the wavefront within the pupil are represented by these higher-order Zernike modes.

"High-order" aberrations of an eye as used herein refers to monochromatic aberrations beyond defocus and astigmatism, namely, third order, fourth order, fifth order, and higher order wavefront aberrations.

Corneal topographic data can be acquired using a corneal topographer or videokeratoscope. Corneal topography data may be in any forms suitable for use in designing an ophthalmic lens. Exemplary forms include, but are not limited to, Zernike polynomials, point cloud data and the like. Preferably, corneal topography data is in a form in which the wavefront aberrations of an eye are quantified. The corneal topography data contained in the set of characteristic data of an eye can also be an averaged corneal topography derived from population studies.

The steps of designing, mathematically slicing and converting are performed in a computer system, which is linked, via interface, to a customer (a patient or an eye-care practitioner). The interface between the computer system and the customer can be any conventional interface, such as internet, network, wide area network, point-to-point dial up connection, hard wire link, wireless link, and the like. Less preferably, the interface is a manual communication means, such as, for example, a paper copy of the prescription, which is transmitted by fax or mail or hand delivered to a computer operator who enters information into the computer using, for example, a keyboard, touch screen, voice recognition hardware and software, or scanner.

In a preferred embodiment of the invention, the method for producing an ophthalmic lens for a specific patient further comprises a step of making available the control signals for the production of the ophthalmic lens. In this embodiment, the control signals can be directly communicated from the computer to the customer via the interface described above, or less preferably the control signals are recorded in a computer-readable medium which is mailed to or hand delivered to the customer.

Figure 1:
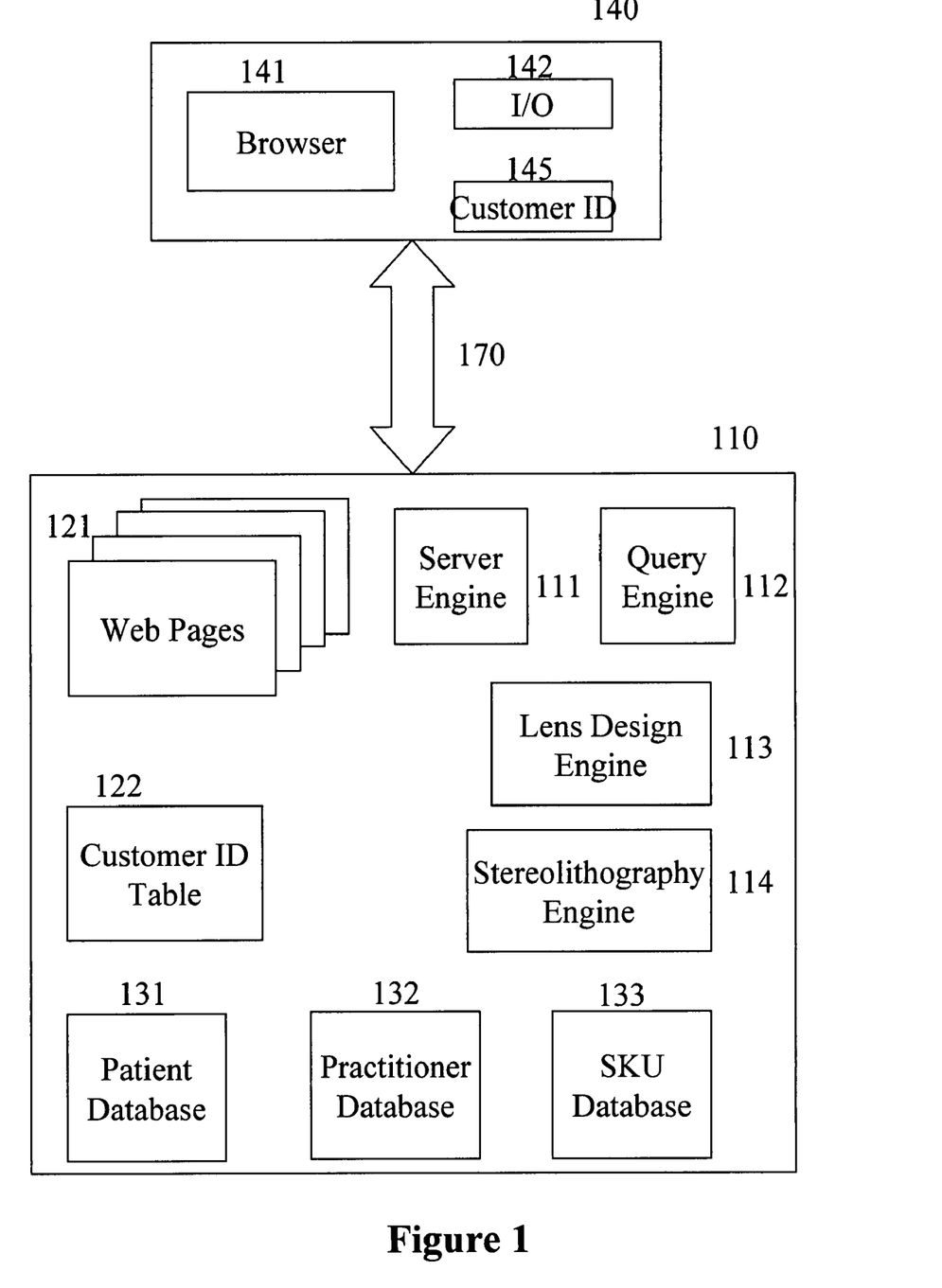
FIG. 1 is block diagram schematically depicting a system and method for producing a pair of ophthalmic lens in a remote location for a specific patient according to a preferred embodiment of the invention.

FIG. 1 is a block diagram illustrating a preferred embodiment of the invention. This preferred embodiment provides a method for producing a pair of ophthalmic lenses in a remote location for a specific patient over the Internet using the World Wide Web.

Referring to FIG. 1, a server system 110 comprises a server engine 111, a lens design engine 113, a query engine 112, a stereolithography engine 114, a customer identifier table 122, various Web pages 121, a patient database 131, an eye-care practitioner database 132, and a SKU database 133.

The server engine 111 receives HTTP requests to access Web pages identified by URLs and provides the Web pages to the various customer computer systems. The server engine also assigns and sends a customer identifier to a customer computer system once when the customer computer system first interacts with the server system. From then on, the customer computer system includes its customer identifier with all messages sent to the server system so that the server system can identify the source of the message.

The lens design engine 113 is a computer program that designs the 3-D mathematical models of a pair of ophthalmic lenses on the basis the prescription of the eyes of the patient. The prescription preferably comprises the wavefront aberrations and corneal topographies of the eyes of an individual. The lens design engine 113 can generate a set physical and optical parameters for this pair of ophthalmic lenses optimized for accommodating the corneal topographies and for correcting aberrations. Such set of physical and optical parameters can be used to produce a new pair of customized lens or be utilized by the query engine 112, that is a computer program, to search against a SKU database which contains all previously designed ophthalmic lenses. The query engine employs an algorithm to find for each of the two eyes a list of SKUs each of which can adequately accommodate the corneal topography of that eye and adequately correct the aberrations of that eye. Such lists of SKUs with lens information, such as one ore more crosslinkable or polymerizable device-forming material, the conformity of each lens to the corneal topography of the corresponding eye, and a reachable visual acuity with a specific SKU. Preferably, the conformity of each lens to the corneal topography of the corresponding eye is displayed in a customer computer system as an interactive three-dimensional graphic representation and the reachable visual acuity with a specific SKU is display in the same computer system as a graphic representation, for example, a simulated retina image quality. The patient can select one crosslinkable or polymerizable device-forming material and one pair of SKUs or can request to design a new pair of ophthalmic lenses.

"A contact lens can correct adequately the aberrations of an eye", as used herein, means that the lens can correct the aberrations of the eye at least to the extent as prescribed by an eye-care practitioner.

The stereolithography engine 114 is a computer program that mathematically slices the 3-D mathematical model of an ophthalmic lens into a number of thin and vertically superimposed layers, each layer having a defined thickness profile and a geometry corresponding to a cross-section of the 3-D mathematical model at the level of that layer, and that converts the thickness profile and the geometry of each of a number of the thin and vertically superimposed layers into control signals that control a stereolithography machine to create, layer by superimposed layer, the ophthalmic lens in a bath of a crosslinkable or polymerizable device-forming material. The generated control signals then will be sent to the customer computer system 140 which controls a stereolithography machine (not shown) to produce a pair of ophthalmic lenses.

The patient database 131 contains patient-specific order information, such as name of the patient, and billing information for various patients or potential patients.

The eye-care practitioner database 132 contains eye-care practitioner-specific order information, such as name of the patient under the eye-care practitioner's care, and address and contact information of the eye-care practitioner, for various patients or potential patients.

The customer identifier table 122 contains a mapping from each customer identifier, which is a globally unique identifier that uniquely identifies a customer computer system, to the patient or eye-care practitioner last associated with that customer computer system.

The customer computer system 140 comprises a browser 141, an assigned customer identifier 142, and input/output (I/O) interface devices. The customer identifier is stored in a file, referred to as a "cookie." An input device receives input (such as data, commands, etc.) from human operators and forwards such input to the customer computer system 140 via a communication medium. Any known, suitable input device may be used in the present invention, such as a keyboard, pointing device (mouse, roller ball, track ball, light pen, etc.), touch screen, etc. User input may also be stored and then retrieved, as appropriate, from data/command files. An output device outputs information to human operators. The customer computer system transfers such information to the output device via a communication medium. Any well known, suitable output device may be used in the present invention, such as a monitor, a printer, a floppy disk drive, a text-to-speech synthesizer, etc. In a more preferred embodiment, a sensor system, that can measure at least wavefront aberrations, preferably at least wavefront aberrations and corneal topography of the eyes of an individual, is connected to the customer computer system via a communication medium.

The customer computer system may comprise any combination of hardware and software that can interact with the server system. One example is a customer computer system comprising a television-based system.

It will be understood that the method of the invention for producing a pair of ophthalmic lens in a remote location for a specific patient can be implemented in various environments other than the Internet. Exemplary environments other than the Internet include, but are not limited to, an electronic mail environment, local area network, wide area network, and point-to-point dial up connection.

The present invention, in still another aspect, provides a system for producing an ophthalmic lens for a specific patient, comprising: a computer or a computer system; a means in communication with said computer or computer system for prompting the patient or his eye care-practitioner, who takes care of the patient, to enter the prescription of an eye of the patient; a means for designing a 3-D mathematical model of the ophthalmic lens based on the prescription; a means for mathematically slicing the 3-D mathematical model into a number of thin and vertically superimposed layers, each layer having a defined thickness profile and a geometry corresponding to a cross-section of the 3-D mathematical model at the level of that layer; a means for converting the thickness profile and the geometry of each of a number of the thin and vertically superimposed layers into control signals that control a stereolithography machine to create, layer by superimposed layer, the ophthalmic lens in a bath of a crosslinkable or polymerizable device-forming material.

The present invention, in a further aspect, provides a computer program product for use in a computer system to produce an ophthalmic lens by means of stereolithography, the computer program product comprising: a recording medium; means, recorded on the recording medium, for designing a 3-D mathematical model of the ophthalmic lens based on the prescription of an eye of a patient; means, recorded on the recording medium, for mathematically slicing the 3-D mathematical model into a number of thin and vertically superimposed layers, each layer having a defined thickness profile and a geometry corresponding to a cross-section of the 3-D mathematical model at the level of that layer; and means, recorded on the recording medium, for converting the thickness profile and the geometry of each of a number of the thin and vertically superimposed layers into control signals that control a stereolithography machine to create, layer by superimposed layer, the ophthalmic lens in a bath of a crosslinkable or polymerizable device-forming material.

The invention has been described in detail, with particular reference to certain preferred embodiments, in order to enable the reader to practice the invention without undue experimentation. Theories of operation have been offered to better enable the reader to understand the invention, but such theories do not limit the scope of the invention. In addition, a person having ordinary skill in the art will readily recognize that many of the previous components, compositions, and/or parameters may be varied or modified to a reasonable extent without departing from the scope and spirit of the invention. Furthermore, titles, headings, example materials or the like are provided to enhance the reader's comprehension of this document, and should not be read as limiting the scope of the present invention. Accordingly, the invention is defined by the following claims, and reasonable extensions and equivalents thereof.

What is claimed is:

1. A method for producing a contact lens for a specific patient, comprising the steps of:
   receiving a prescription comprising a set of characteristic data of an eye of said specific patient;
   designing a 3-D mathematical model of the contact lens based on the prescription;
   mathematically slicing the 3-D mathematical model into a number of thin and vertically superimposed layers, each layer having a defined thickness profile and a geometry corresponding to a cross-section of the 3-D mathematical model at a level of that layer; and
   converting a thickness profile and the geometry of each of a number of the thin and vertically superimposed layers into control signals that control a stereolithography machine to create, layer by superimposed layer, the contact lens in a bath of a crosslinkable or polymerizable contact lens forming material, wherein said contact lens forming material comprises one or more UV absorbing agents in an amount sufficient to reduce depth of penetration of a lens-forming material to a desired value.

2. A method of claim 1, wherein the method further comprises producing a ophthalmic lens by the stereolithography machine.

3. A system for producing an ophthalmic lens for a specific patient, comprising:
   a computer system;
   a means in communication with said computer system for prompting said specific patient or his eye care-practitioner, who takes care of the specific patient, to enter a prescription of an eye of the patient;
   a means for designing a 3-D mathematical model of an ophthalmic lens based on the prescription; a means for mathematically slicing the 3-D mathematical model into a number of thin and vertically superimposed layers, each layer having a defined thickness profile and a geometry corresponding to a cross-section of the 3-D mathematical model at a level of that layer;
   a means for converting the defined thickness profile and the geometry of each of a number of the thin and vertically superimposed layers into control signals that control a stereolithography machine to create, layer by superimposed layer, the ophthalmic lens in a bath of a crosslinkable or polymerizable device-forming material,
   wherein said system further comprises a wavefront sensor which determines the wavefront aberrations of an eye of the patient.

4. The system of claim 3, wherein said means in communication with said computer system is a modem linked to a computer through Internet.

5. The system of claim 3, wherein said system further comprises a corneal topographer or videokeratoscope which determines corneal topographic data of the eye.

6. A system of claim 3, wherein said system further comprises a stereolithography machine.

7. A computer program product for use in a computer system to produce an ophthalmic lens by means of stereolithography, comprising:
   a recording medium;
   means, recorded on the recording medium, for designing a 3-D mathematical model of the ophthalmic lens based on a prescription based on the prescription of an eye of a patient;
   means, recorded on the recording medium, for mathematically slicing the 3-D mathematical model into a number of thin and vertically superimposed layers, each layer having a defined thickness profile and a geometry corresponding to a cross-section of the 3-D mathematical model at a level of that layer; and
   means, recorded on the recording medium, for converting the defined thickness profile and the geometry of each of a number of the thin and vertically superimposed layers into control signals that control a stereolithography machine to create, layer by superimposed layer, the ophthalmic lens in a bath of a crosslinkable or polymerizable device-forming material.

* * * * *